(12) United States Patent
Peddle

(10) Patent No.: US 7,238,550 B2
(45) Date of Patent: Jul. 3, 2007

(54) METHODS AND APPARATUS FOR FABRICATING CHIP-ON-BOARD MODULES

(75) Inventor: Charles I. Peddle, Las Vegas, NV (US)

(73) Assignee: Tandon Group Ltd., Simi Valley, CA (US)

( * ) Notice: Subject to any disclaimer, the term of this patent is extended or adjusted under 35 U.S.C. 154(b) by 274 days.

(21) Appl. No.: 10/371,800

(22) Filed: Feb. 20, 2003

(65) Prior Publication Data

US 2003/0159278 A1    Aug. 28, 2003

Related U.S. Application Data

(60) Provisional application No. 60/360,036, filed on Feb. 26, 2002.

(51) Int. Cl.
H01L 21/44 (2006.01)
H01L 21/48 (2006.01)
H01L 21/50 (2006.01)

(52) U.S. Cl. .............. 438/118; 257/E21.505

(58) Field of Classification Search ........... 438/118
See application file for complete search history.

(56) References Cited

U.S. PATENT DOCUMENTS

| | | | | |
|---|---|---|---|---|
| 4,647,959 A * | 3/1987 | Smith | | 257/668 |
| 5,477,611 A * | 12/1995 | Sweis et al. | | 29/840 |
| 5,866,953 A * | 2/1999 | Akram et al. | | 257/790 |
| 5,962,810 A * | 10/1999 | Glenn | | 174/52.2 |
| 5,981,314 A * | 11/1999 | Glenn et al. | | 438/127 |
| 6,020,218 A * | 2/2000 | Shim et al. | | 438/111 |
| 6,049,124 A * | 4/2000 | Raiser et al. | | 257/712 |
| 6,117,797 A * | 9/2000 | Hembree | | 438/759 |
| 6,119,049 A | 9/2000 | Peddle | | |
| 6,143,588 A * | 11/2000 | Glenn | | 438/116 |
| 6,214,644 B1 * | 4/2001 | Glenn | | 438/108 |
| 6,238,948 B1 * | 5/2001 | Ramalingam | | 438/106 |
| 6,238,951 B1 * | 5/2001 | Caillat | | 438/108 |
| 6,252,308 B1 * | 6/2001 | Akram et al. | | 257/787 |
| 6,274,927 B1 * | 8/2001 | Glenn | | 257/680 |
| 6,306,688 B1 * | 10/2001 | Lunceford | | 438/127 |
| 6,420,204 B2 * | 7/2002 | Glenn | | 438/64 |
| 6,441,481 B1 * | 8/2002 | Karpman | | 257/711 |
| 6,512,286 B1 * | 1/2003 | Tsai et al. | | 257/666 |
| 6,528,345 B1 * | 3/2003 | Cook et al. | | 438/108 |
| 6,569,709 B2 * | 5/2003 | Derderian | | 438/109 |
| 6,603,183 B1 * | 8/2003 | Hoffman | | 257/434 |
| 6,784,555 B2 * | 8/2004 | Watson | | 257/783 |

(Continued)

*Primary Examiner*—David A. Zarneke
(74) *Attorney, Agent, or Firm*—Steven L. Nichols; Rader, Fishman and Grauer PLLC (57) ABSTRACT

An improved method for fabricating Chip-on-Board memory modules using partially-defective memory chips or a combination of partially-defective and flawless memory parts, comprises mounting unpackaged (or a combination of packaged and unpackaged) memory parts to a printed circuit board using one or more selectively settable materials, testing and patching the memory parts, and providing a protective cover after a suitable combination of memory parts and patches produces a fully-functional memory module. Also, a new set of printed circuit boards designed to allow fabrication of memory modules using single-bit patching, any-bit patching, and DDR technology with unpackaged memory parts. In a preferred embodiment, the method and printed circuit boards mentioned above are combined to produce a number of low-cost memory modules using modern, available partially-defective and flawless memory parts.

39 Claims, 9 Drawing Sheets

U.S. PATENT DOCUMENTS

| | | | |
|---|---|---|---|
| 6,828,674 B2 * | 12/2004 | Karpman | 257/711 |
| 6,841,412 B1 * | 1/2005 | Fisher et al. | 438/106 |
| 6,873,034 B2 * | 3/2005 | Nakamura et al. | 257/680 |
| 6,875,635 B2 * | 4/2005 | Cheng et al. | 438/118 |
| 2002/0090752 A1 * | 7/2002 | Nakanishi | 438/107 |
| 2002/0182774 A1 * | 12/2002 | Heckman | 438/118 |

* cited by examiner

METHODS AND APPARATUS FOR FABRICATING CHIP-ON-BOARD MODULES

RELATED APPLICATIONS

The present invention claims the filing date of U.S. Provisional Patent 60/360,036, filed on Feb. 26, 2002, and references the related U.S. patent application Ser. No. 10/371,663, entitled "Improved Patching Methods and Apparatus for Fabricating Memory Modules," filed Feb. 20, 2003, both of which are herein incorporated by this reference.

TECHNICAL FIELD

Selected embodiments of the present invention relate to electronic logic modules that use unpackaged die. More specifically, embodiments of the present invention relate to fabrication processes for Chip-on-Board modules.

BACKGROUND

Semiconductor manufacturing processes have become increasingly more complex. From the beginning with the creation of discrete transistors and other semiconductor devices through subsequent medium and large scale integrated devices, the number of transistors or independent elements which can fit on to a semiconductor chip has grown exponentially each year. For example, the first integrated processors comprised on the order of 2300 transistors. A recently announced integrated circuit processor comprises more than 220 million transistors. Other circuits are projected to contain over 1 billion transistors in the foreseeable future.

This continued exponential growth of semiconductor manufacturing processes, while contributing to the greatly decreased costs of individual semiconductor devices and products has also exacerbated many production and testing problems associated with commercial semiconductor manufacturing processes. The substantial increase in the density of electronic circuits in the semiconductor integrated manufacturing processes has resulted in the production of many more less-than-perfect semiconductor die or chips. This increase in the production of less than perfect chips and die has spawned a new market for electronic component sellers who find ways to utilize less-than-perfect chips or die to assemble working components.

The many enhancements and advancements in semiconductor manufacturing and packaging processes have resulted in the creation of a number of price sensitive semiconductor product applications for electronic parts sellers. In particular, these electronic parts sellers develop low cost memory modules or other semiconductor devices through the utilization of cost effective processes, including less-than-perfect semiconductor parts.

One method of building memory modules using partially-defective memory parts may use unpackaged semiconductor memories, or die, for all or part of the memory parts used to build a memory module. Using die instead of packaged parts increases the complexity of the fabrication process, but provides substantial savings by eliminating the cost of packaging parts. The use of unpackaged parts to build memory modules, or other electronics, is called Chip-on-Board, or COB. In recent years, improvements in semiconductor memory technology and manufacturing have led to the creation of new memory products and patching techniques implemented using a Chip-on-Board process.

While the process used to assemble Chip-on-Board modules, referring to the process disclosed in U.S. Pat. No. 6,119,049, is effective, modem adhesives provide new methods of mounting unpackaged parts. In particular, an improvement in the yield of Chip-on-Board memory modules can be attained by using one or more selectively settable liquids. A standard burn-in process used to test electronic memory modules (including Chip-on-Board modules) under high heat and high voltage stress may frequently cause a number of failed and broken chips, due mostly to a difference in the thermal expansion coefficients of the chips and the circuit board base.

In summary, there is an ongoing need in the art for means and methods of producing low cost semiconductor devices, particularly memory modules. Related to this is an ongoing need to make use of semiconductor devices that are partially-defective so that such device are not completely wasted. The use of unpackaged parts, including new mounting techniques, is desirable to provide important cost saving practices.

SUMMARY OF SELECTED EMBODIMENTS

Among many possible embodiments, the present invention provides a number of Chip-on-Board memory modules fabricated using a variety of patching methods and a new and novel mounting process. Each Chip-on-Board memory module preferably uses partially-defective memory parts or a combination of partially-defective and flawless memory parts.

Another embodiment of the present invention includes mounting unpackaged electronic parts, not limited to memory parts, using one or more selectively settable liquids. By tacking an unpackaged electronic part to a circuit board base, hereafter described as a PC board, using one or more selectively settable liquids, part adjustments such as repositioning, removal, and bonding wire installation are greatly expedited and facilitated.

Another embodiment of the present invention encompasses a variety of memory modules, including, Dynamic Random Access Memory (DRAM), Synchronous Dynamic Random Access Memory (SDRAM), Double Data Rate (DDR), etc., created using the presently described Chip-on-Board fabrication method. These modules may use a number of patching methods, e.g., the methods described in U.S. Pat. No. 6,119,049. Additionally, new patching methods are described in the above referenced patent application, "Methods and Apparatus for Patching Memory Modules," which is co-pending and of common ownership with the present application by U.S. Pat. No. 6,119,049 inventor, Charles I. Peddle, and may be used to fabricate the Chip-on-Board memory modules.

BRIEF DESCRIPTION OF THE DRAWINGS

The accompanying drawings illustrate various embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate similar, but not necessarily identical, elements.

DETAILED DESCRIPTION OF SELECTED EMBODIMENTS

Chip-on-Board memory modules fabricated using partially-defective memory parts or a combination of partially-defective and flawless memory parts are disclosed herein. A combination of memory parts, which in one embodiment includes at least one unpackaged chip, are mounted on a printed circuit board and tested. By using one or more selectively settable liquids to mount unpackaged memory chips, a number of fabrication benefits are facilitated, e.g., unpackaged chips are easily oriented, bonding wires are secured, memory chips may be removed if necessary, etc. A number of different circuit boards, memory parts, and patching techniques result in a variety of functional modules. Additionally, a cover may be used as part of the module for aesthetic value and protection of fragile parts, leads, wires, etc.

The embodiments described involve an effective utilization of semiconductor chips or die which both benefit the semiconductor manufacturers by reducing their production losses and various electronic system manufacturers which are often able to utilize lower cost memory and subcomponents manufactured using less-than-flawless semiconductor memories.

Figure 1:
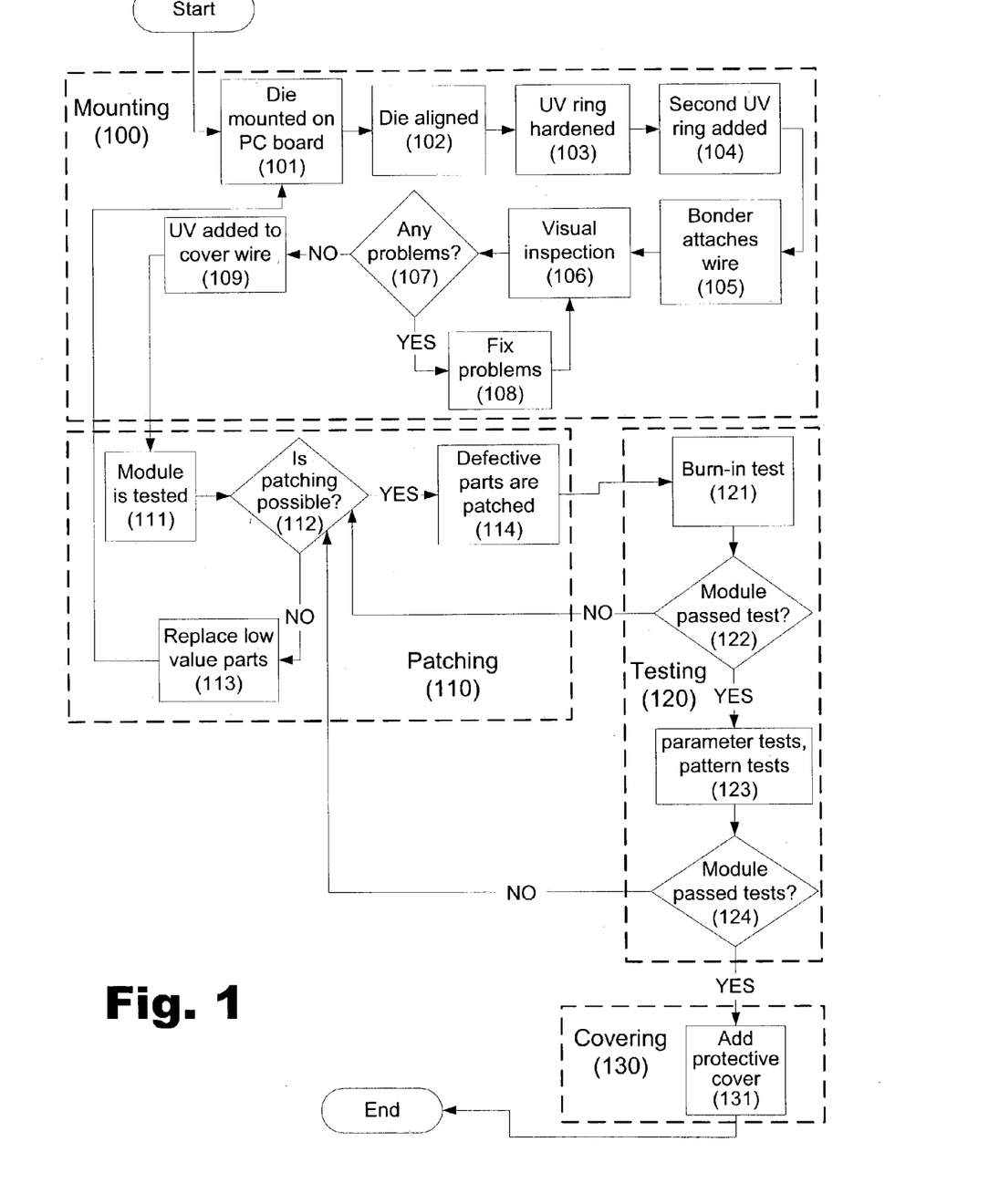
FIG. 1 is a flowchart illustrating a method of manufacturing Chip-on-Board memory modules according to one embodiment of the present invention.

FIG. 1 is a flowchart illustrating a method of assembling a Chip-on-Board memory module. As shown in FIG. 1, the method may be divided into several areas or steps: mounting (step 100), patching (step 110), testing (step 120), and covering (step 130).

During mounting (step 100), preferably, at least one unpackaged chip is mounted on a printed circuit board. In some embodiments, a selectively settable material may be used to mount unpackaged memory parts. More specifically, selectively settable liquids, such as adhesives made by Dymax Corporation, are used, in some examples, to tack die to a PC board.

While many types of adhesives may be used to tack unpackaged die to a PC board, UV material, i.e., material hardened by exposure to certain wavelengths of light, is used in selected embodiments. When using UV material, different wavelengths of light may cause different levels of hardness. For example, light with 700 nm (nanometers) wavelength may cause a certain liquid UV material to thicken, while light at 1000 nm causes the UV material to permanently harden. Accordingly, tools that dispense UV material and emit light may be used in the process. Such tools include the PC-3D made by Dymax.

When mounting die on a PC board (step 101), a ring of selectively settable material is preferably used to surround the die and hold the die in place. Once mounted, the alignment of each unpackaged chip may be adjusted (step 102), after which the ring of selectively settable material disposed around the chip is cured or hardened (step 103). The hardened ring around each die keeps the die in place. In some embodiments, the ring is higher than the die it surrounds to facilitate the addition of bond wires.

A layer of selectively settable material is placed between each die and the PC board. In one embodiment, the same settable material that is used between each die and the PC board may also be used around each die or two different selectively settable materials may be used.

More specifically, the selectively settable material used between the die and the PC board should have a higher curing temperature than the material used around the die. This configuration allows the material around the die to be hardened, while the material between the die and the PC board remains liquid. For example, when using UV material, light at a specified wavelength will harden the ring around the die, while the material between the die and the PC board remains liquid. In other words, using two different materials allows a memory part to be firmly tacked to the PC board, while being buffered, or padded, physically and thermally from the surface of the PC board to which it is mounted. Alternatively, if the same selectively settable material is used underneath and around the die, care may be taken to harden only the outer ring of the selectively settable material.

A second ring (or layer) of selectively settable material may also be added (step 104) on top of the first ring of selectively settable material. This second ring is used to capture the wires, known as bonding wires, which electrically connect the die to the conductive pads of the PC board. The wires may be captured by carefully placing the wires within the second ring while the selectively settable material is still manageable and then hardening the ring. The use of the second ring prevents the wires from touching the die or other wires. After the bonding wires are captured, the memory unit can be loaded into a bonding machine that locates each die and, using an automated program, bonds the wires to the contact pads on the die and the PC board (step 105).

After the wires are bonded, connecting the die to the module, a visual inspection of the wires is made (step 106). If there are any missing or broken wires (determination 107), a manual adjustment of the bonds (step 108) is used to correct the problem. The unit is visually inspected again (step 107), and if there are no missing or broken wires (determination 107), a small amount of selectively settable material is placed over the wires and hardened (step 109).

Any packaged parts used on a Chip-on-Board memory module may be mounted by soldering the leads of the package to pads on the circuit board. Specific pads on the PC board are usually designed purposely for use with packaged or unpackaged parts. As used herein, a "Chip-on-Board" PC board may contain any combination of pads utilizable for connecting memory devices to the PC board. Preferably, at least one set of pads is designed for use with an unpackaged part or device.

After the memory parts have been mounted (step 100), the patching process (step 110) begins. Preferably, the module is first tested (step 111) using a series of read/write functionality tests, and defective I/O lines are identified. If the defective parts can be patched (determination 112), the patching technique corresponding to the particular memory product and PC board layout is used to patch the defective parts (step 114). As herein above mentioned, the patching processes of U.S. Pat. No. 6,119,049 and co-pending patent application, "Method and Apparatus for Patching Memory Modules," may be used.

All patching techniques require the disconnection of failed I/O lines and the connection of other unused, functional I/O lines. The disconnection and connection may be accomplished by adding or removing solder, called solder-dots. Another alternative is to add or remove a jumper wires.

If there are not enough bits to patch the defective parts (determination 111), one or more low value parts, i.e., parts with few operable I/O lines, must be replaced with higher value parts (step 113) to provide sufficient bits for a fully-functional module. As used herein, the "value" of a memory part refers to the proportion of functioning, as opposed to non-functioning, input/output lines. A higher value part, used to replace a low value part, must pass through the mounting process (step 100) before the module can continue on to the patching process (step 110).

After a suitable combination of memory parts and patches provides a functional module, the module goes through a testing process (step 120). Preferably, the module is first placed under a high heat and high voltage test called burn-in (step 114). The burn-in test (step 114) accelerates the aging process of the electronics and may cause "early-life" failures to occur in the oven. If a fail occurs during burn-in (determination 122), the patching process (step 110), and if needed the mounting process (step 100), is repeated until a module passes the burn-in test (determination 122).

As indicated above, the uncured adhesive liquid that remains under a select memory die serves as a thermal and physical buffer between the die and the PC board. This buffer may be valuable during the burn-in test to prevent damage to the unit caused by unequal thermal expansion coefficients of the die and the PC board.

There are a number of commercially available testers, which may be used to test memory in the form of die, chips (packaged parts), and modules. Such testers are commonly known in the art. Additionally, commercially available machines used for burn-in tests, bonding wire installation, etc., are commonly known in the art.

Once a module passes the burn-in test (determination 122), an industry standard parameter test, called a "four-corner" test, is performed (step 123), testing the combinations: high voltage/high signal level, high voltage/low signal level, low voltage/high signal level, and low voltage/low signal level. This test assures memory modules that pass a number of subsequent pattern tests (step 123) will run the same on any motherboard.

If the module fails either the parameter test or the pattern test (determination 124), the patching process (step 110) and testing process (step 120) are repeated until a module passes the parameter and pattern tests (determination 124).

If desired, a cover can then be added (step 131) to protect the memory parts and all exposed circuitry on the surface of the PC board. In some embodiments, the cover provides ESD (Electrostatic Discharge) protection to the module, but does not act as a heat sink, i.e., the cover does not touch the memory parts.

The process of FIG. 1 may be carried out using automated machinery for fabrication, patching, and testing purposes. In one embodiment, automated machines are programmed to dispense one or more selectively settable liquids, mount memory parts to a PC board, connect I/O bit lines to I/O output lines, perform functionality tests, attach the protective cover, etc. In another embodiment, the dispensing of selectively settable liquids, mounting of memory parts to a PC board, connecting I/O bit lines to I/O output lines, performing functionality tests as described above, mounting a protective cover, etc., may be performed manually. Another embodiment of the Chip-on-Board fabrication process, shown in FIG. 1, uses a combination of automated and manual labor.

Figure 2:
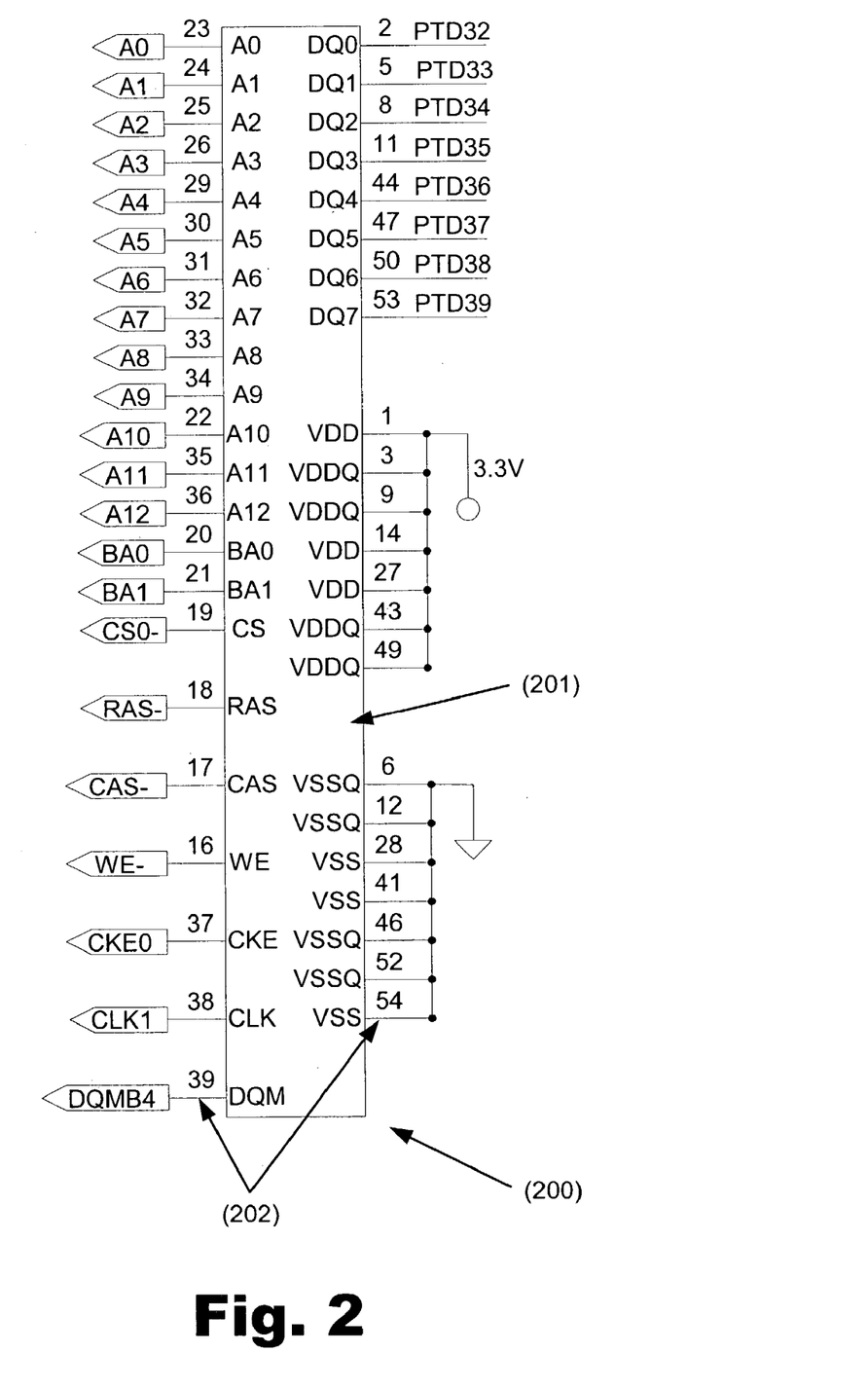
FIG. 2 is a schematic diagram illustrating a memory part that may be used to fabricate a memory module according to one embodiment of the present invention.

FIG. 2 is a schematic diagram of a memory part that may be used to build a memory module as described herein. As shown in FIG. 2, the memory part (200) may be represented by a block (201) and a number of labeled pins (202). The memory part itself (200) may be any size or shape, and the pins (202) may be located at any location on the surface of the semiconductor material from which the memory part (200) is made. There are many types of memory units and technologies, e.g., DRAM, SDRAM, Single Inline Memory Module (SIMM), Dual Inline Memory Module (DIMM), BGA (Ball Grid Array), etc. In general, these memory units and technologies perform the same functions, and are described by Table 1.

TABLE 1

| Symbol | Type | Description |
| --- | --- | --- |
| A[n:0] | Input-Synchronous | Pin definitions; a function of array size |
| CLK | Input-Clock | Master Clock input |
| CKE | Input-Clock Enable | Activates CLK when high, deactivates when low |
| RAS# | Input-Synchronous | Row address strobe |
| CS# | Input-Synchronous | Selects chip when active |
| CAS# | Input-Synchronous | Column address strobe |
| WE# | Input-Synchronous | Write enable strobe |
| DQM# |  | Read mode - controls the data output buffers |
| DQML/H# | Input-Synchronous | Write mode - masks data from being written |
| DQ(x:0) | Input/Output-Synchronous | Data I/O pins |
| Vcc, Vss | Power pins | Supply pins for the core |
| VccQ, VssQ | Power pins | Supply pins for the output buffers |

As shown in Table 1, a variety of signals function together to read data and write data using a memory part (200). In particular, these signals allow a host device to activate a memory part (200), access a particular memory segment defined by row and column, write information to the memory cells, read information from the memory cells, etc.

Figure 3:
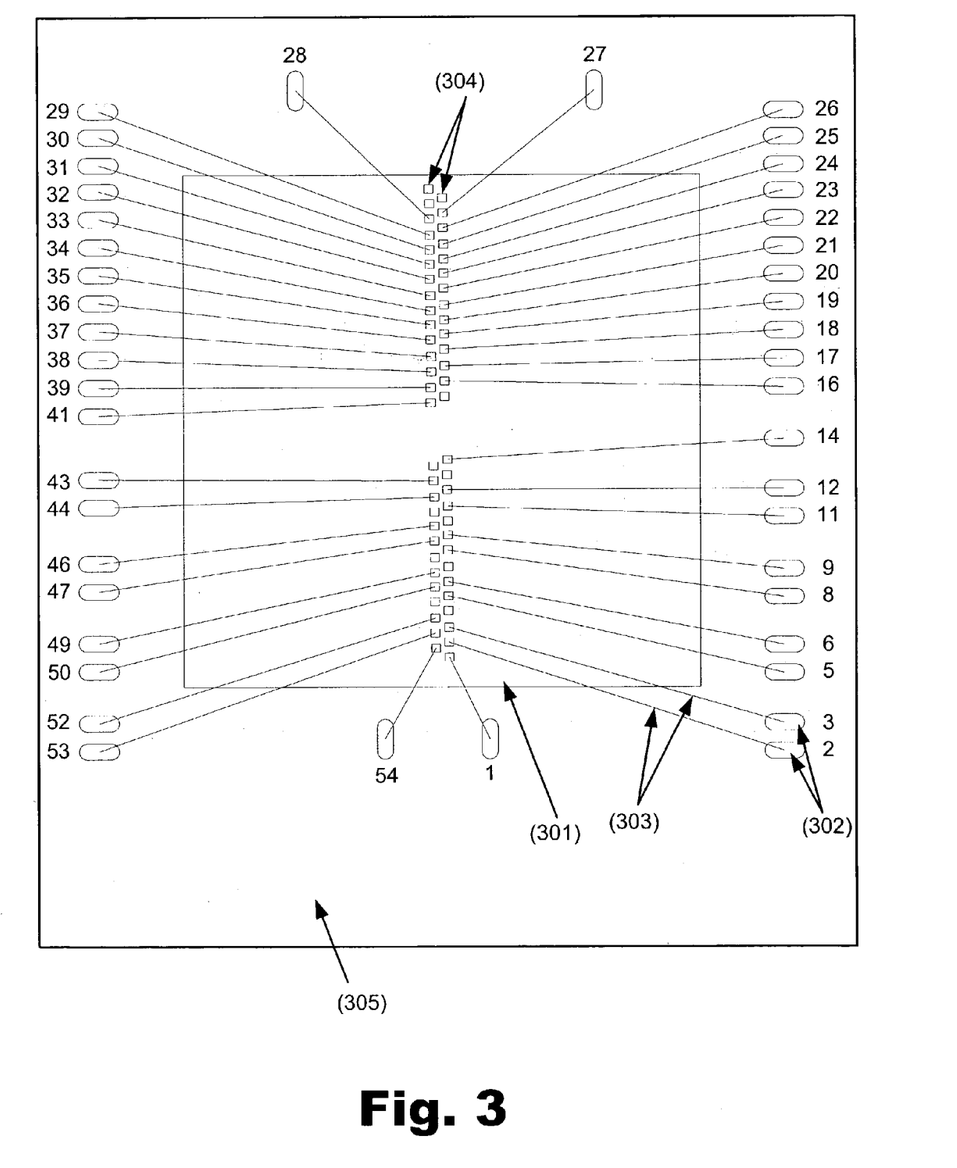
FIG. 3 is an illustration of a top-view of an unpackaged semiconductor chip with inline central pads connected to a PC board base according to one embodiment of the present invention.

FIG. 3 is an illustration of a top-view of an unpackaged memory chip with in-line central pads connected to a printed circuit board base. As shown in FIG. 3, the input and output signals, e.g., the signals of Table 1, may be connected to a host device by bonding wires (303) between pads (304) of the unpackaged memory part (301) to pads (302) on a circuit board (305). The pads (302) of the circuit board (305) may be pre-wired to allow a host device to effectively utilize the memory part (301). Specifically, the memory part (301) of FIG. 3 is an illustration of a physical embodiment of the memory part (200) schematic of FIG. 2 attached to a PC board. As illustrated, the pin numbers (202) of FIG. 2, representing particular signals, are also illustrated in FIG. 3.

Figure 4A:
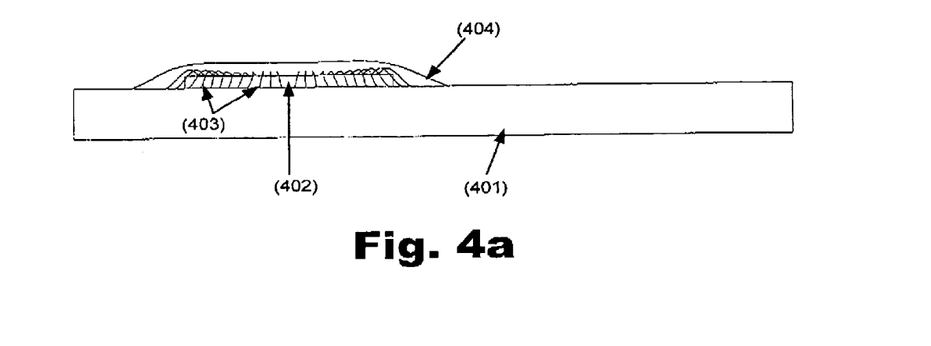
FIG. 4a is a perspective side view of a Chip-on-Board memory module according to one embodiment of the present invention.

FIG. 4a is a perspective side view of a Chip-on-Board memory module. As shown in FIG. 4a, an unpackaged memory part (402) is attached to a PC board (401), and wires (403) connect the signals of the memory part (402) to the circuit board (401). In order to protect the wires (403) and unpackaged die (402), a selectively settable liquid (404) is dispensed around the die (402), wires (403), pads, etc., and hardened.

Figure 4B:
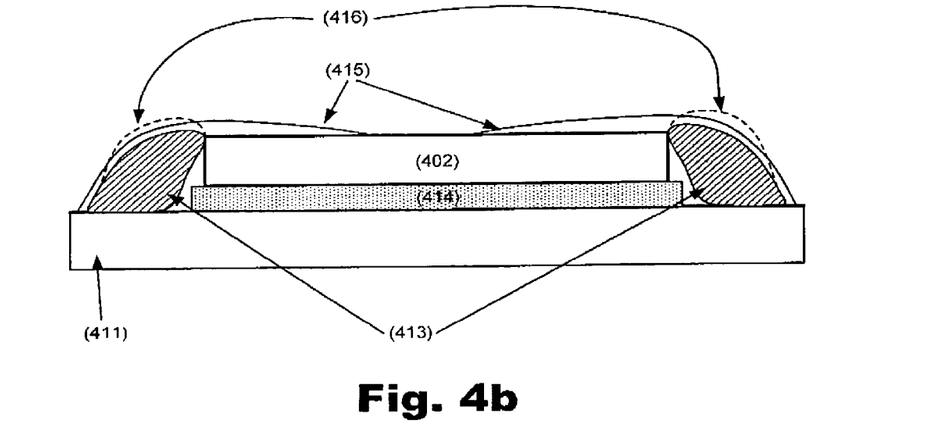
FIG. 4b is a close-up cross-sectional view of an unpackaged part mounted to a PC board according to one embodiment of the present invention.

FIG. 4b is a close-up cross-sectional view of an unpackaged part mounted to a PC board. As shown in FIG. 4b, an unpackaged part (412) is mounted to a PC board (411) using several sections of selectively settable material, wherein the unpackaged part (412) may consist of but is not limited to, semiconductor chips or die. A first section of selectively settable material (414) is placed between the unpackaged part (412) and the PC board (411). In some embodiments, this first section of selectively settable material (414) remains liquid and provides a physical and thermal pad between the unpackaged part (412) and PC board (411).

In order to tack the unpackaged part (412) to the PC board (411) a ring (or layer) of selectively settable material (413) is placed around the perimeter of the unpackaged part (412). After the unpackaged part (412) is correctly oriented, the ring of selectively settable material (413) is hardened, thereby tacking the unpackaged part (412) to the PC board (411). Additionally, the height of this first layer (413) may be higher than the unpackaged part (412), thus allowing bonding wires to rest on the first layer (413) without touching the unpackaged part (412).

After being hardened, the first ring of selectively settable material (413) may be covered with a second ring (or layer) of selectively settable material (416). By placing part of the bonding wires (415) within the second layer of selectively settable material (416) and hardening the second layer (416), the wires (415) may be captured. By trapping the wires (415), the process of connecting bonding wires between a unpackaged part (412) and a PC board (411) is greatly facilitated. During this process, care should be taken to separate each bonding wire (415) within the second ring of selectively settable material (416) to avoid shorting wires (415) together.

Figure 5:
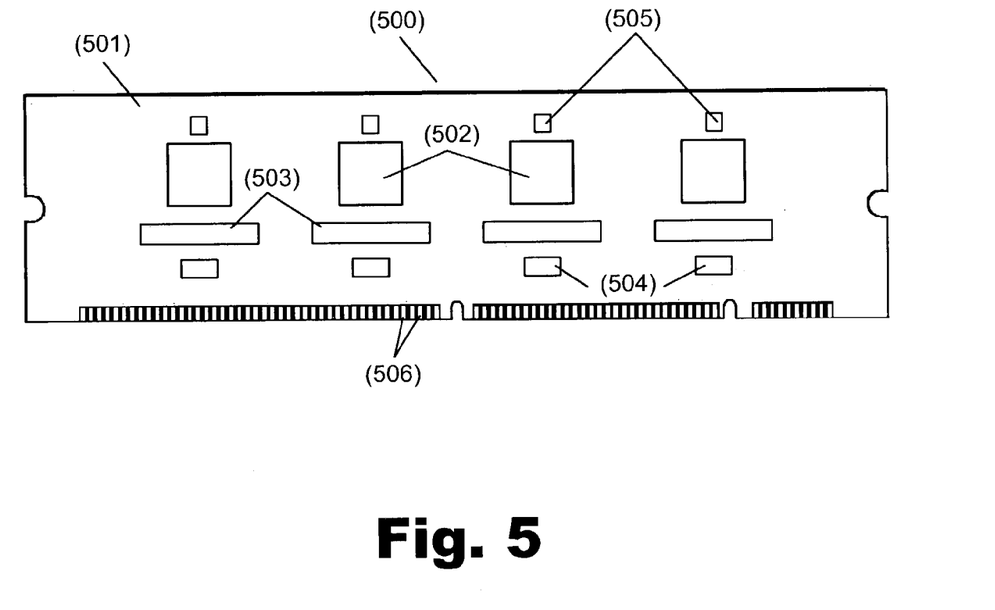
FIG. 5 is a block diagram illustrating a layout of major components of a Chip-on-Board memory module fabricated using patching networks according to one embodiment of the present invention.

FIG. 5 is a block diagram illustrating a layout of major components of a Chip-on-Board memory module fabricated using patching networks. As shown in FIG. 5, the memory module (500) comprises a printed circuit board (501), memory parts (502), patching networks (503), resistor elements (504), capacitor elements (505), and interface connections (506), wherein the memory parts (502) may consist of, but are not limited to, packaged or unpackaged memory parts. Additionally, other electrical components, e.g., voltage regulators, inductors, phase locked loop units, differential clock drivers, etc., maybe mounted to the circuit board (501).

The printed circuit board (501) uses several different layers to create a complex network of electrical paths and connection points purposefully designed to allow the fabrication of a functional memory product using the patching networks (503) and partially-defective memory parts (502).

There are a variety of memory products that may be assembled using the module (500) illustrated in FIG. 5, e.g., Single Inline Memory Module (SIMM), Dual Inline Memory Module (DIMM), Dynamic Random Access Memory (DRAM), Synchronous Dynamic Random Access Memory (SDRAM), etc. In general, memory parts, e.g., the memory part of FIG. 2, enable a host device to store and access one or more bits, i.e., an electronic, or logic, 1 or 0. A single bit or group of bits, i.e., byte, word, etc., stored and accessible in memory, provide information significant to the host device and software applications running on the host device.

The I/O signals, e.g., DQ(x:0) in Table 1, of the memory parts (502; FIG. 5) are connected to one or more patching networks (503). The patching networks (503) comprise a collection of traces, etc., that allow one I/O signal line to be substituted with another I/O signal line by manually or automatically changing the connection at one or more designated locations. Preferably, the patching solution uses more controllable memory parts (502) than past patching solutions, e.g., the solutions presented in U.S. Pat. No. 6,119,049, to accomplish another process for patching memory parts. Some examples of patching networks that maybe used include 2-to-1, 4-to-1, and 8-to-1 patching networks as described in the co-pending patent application entitled, "New Methods and Apparatus for Patching Memory Modules."

Specifically, the memory parts (502) shown in FIG. 5 allow the host device to provide a number of additional read/write control signals, e.g., DQM# in Table 1, that eliminate the need to steer CAS (Column Address Select) and RAS (Row Address Select) signals to the memory parts (502) used for patching. Instead, memory parts (502) that are used to substitute failed memory outputs share the same read/write control signals as the memory part (502) whose output they are replacing. Typical memory parts include 8M×8, 16M×8, and 32M×8 memory parts commonly used in the art to build memory modules.

In operation of the memory module (500) fabricated using the patching networks (503), all I/O signals are sent through resistance networks (504) that provide a buffer between the memory part (502) and the host device accessing the memory. Another component of the memory module (500) is a group of capacitors (505), which serve to stabilize the power supply signal for each memory part (502) by removing most high frequency electrical noise that may occur.

The interface connections (506) enable the memory module (500) to be conveniently plugged into an appropriate connection device of a host device. Through the connection, the host device is able to interact with the memory module (500) as herein above described, etc. For more detailed information regarding patching networks (503) and processes, a reference may be made to U.S. Pat. No. 6,119,049 and the co-pending patent application, entitled, "Improved Patching Methods and Apparatus for Fabricating Memory Modules."

Figure 6:
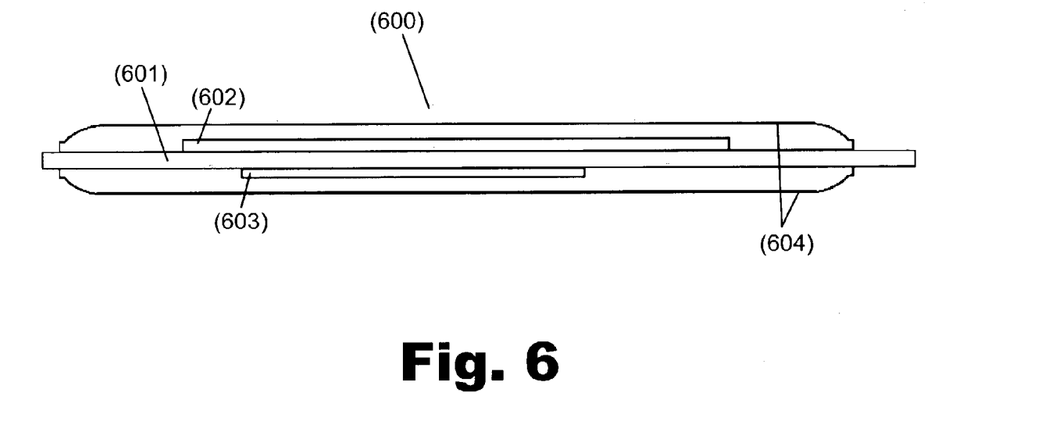
FIG. 6 is an illustrative cross-sectional view of a shielded Chip-on-Board memory module according to one embodiment of the present invention.

FIG. 6 is an illustrative cross-sectional view of a shielded Chip-on-Board memory module. As shown is FIG. 6, the module (600) uses a PC board (601) as a base. Attached to the PC board (601) are packaged parts (602) and unpackaged parts (603). In particular, any combination of packaged parts (602) and unpackaged parts (603) may be used. In some embodiments, at least one unpackaged part is used (603).

Covering the memory parts (and any other electronics, leads, wires, etc.) is a cover (804), which may be mounted to the PC board (601). In at least one embodiment, there is no electrical or physical contact between the cover (604) and the memory parts (602, 603) such that the cover (604) does not act as a heat sink for the memory parts (602, 603). The cover (604) advantageously increases the security and aesthetic appearance of the module (600).

Figure 7:
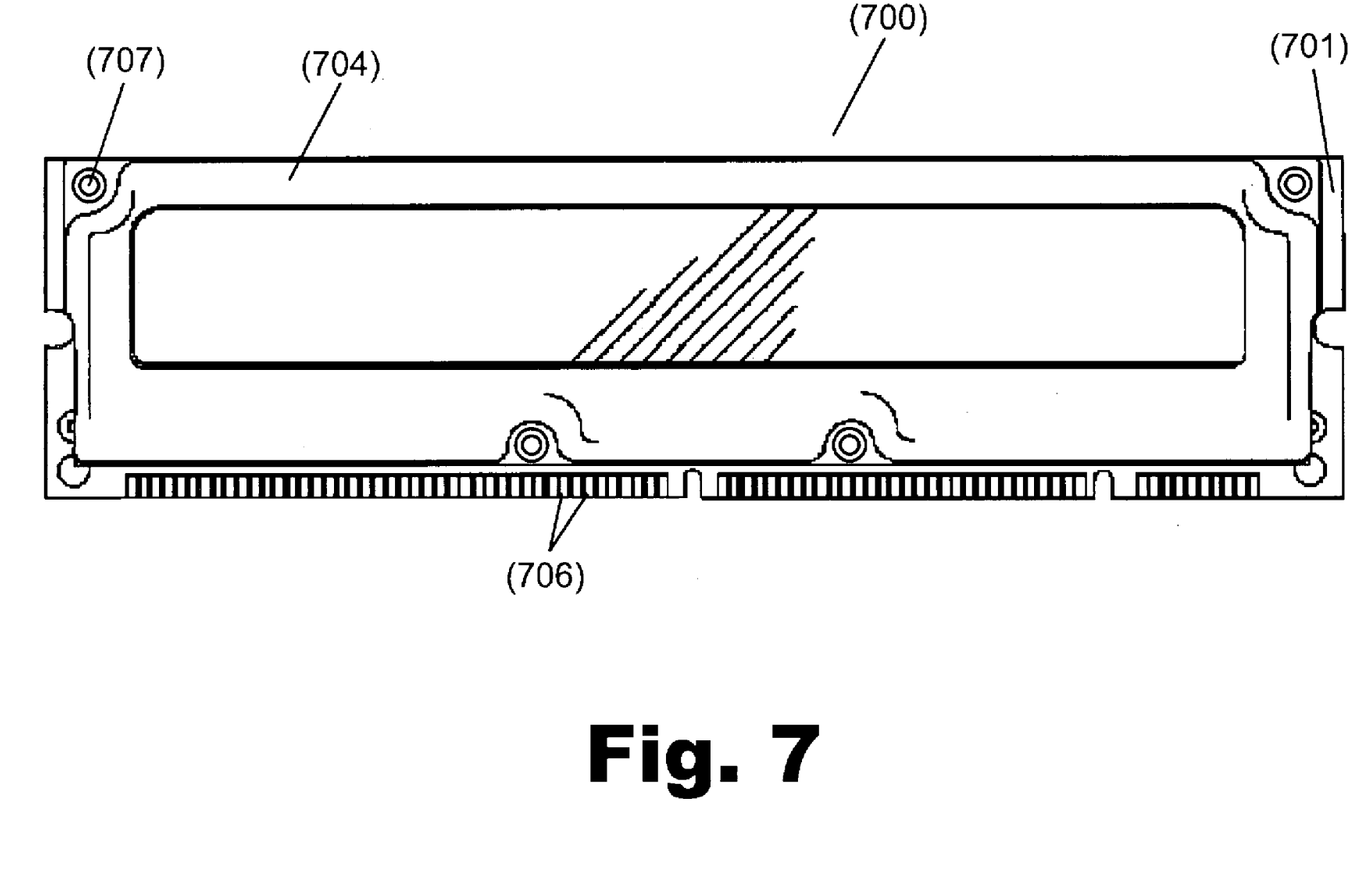
FIG. 7 is an illustrative top-view of a Chip-on-Board memory module according to one embodiment of the present invention.

FIG. 7 is an illustrative top-view of a Chip-on-Board memory module. As shown in FIG. 7, a cover (704) is attached on one or both sides of the module (700) using rivets (707), or other fasteners, that attach the cover (704) to the PC board (701). As an added protection, a ground plane of the PC board (701) may be made to connect to one or more rivets (707) touching the cover (704), thus providing a means of discharging any electrostatic charges, i.e., ESD (Electrostatic Discharge), that could potentially damage the module (700). The cover (704) also provides physical protection to any electronics, wires, etc., used to create the memory module (700). Using the interface connections (706), the module may be connected to any device, e.g., the motherboard of a host device, equipped to read and write information to the particular memory module (700).

Figure 8:
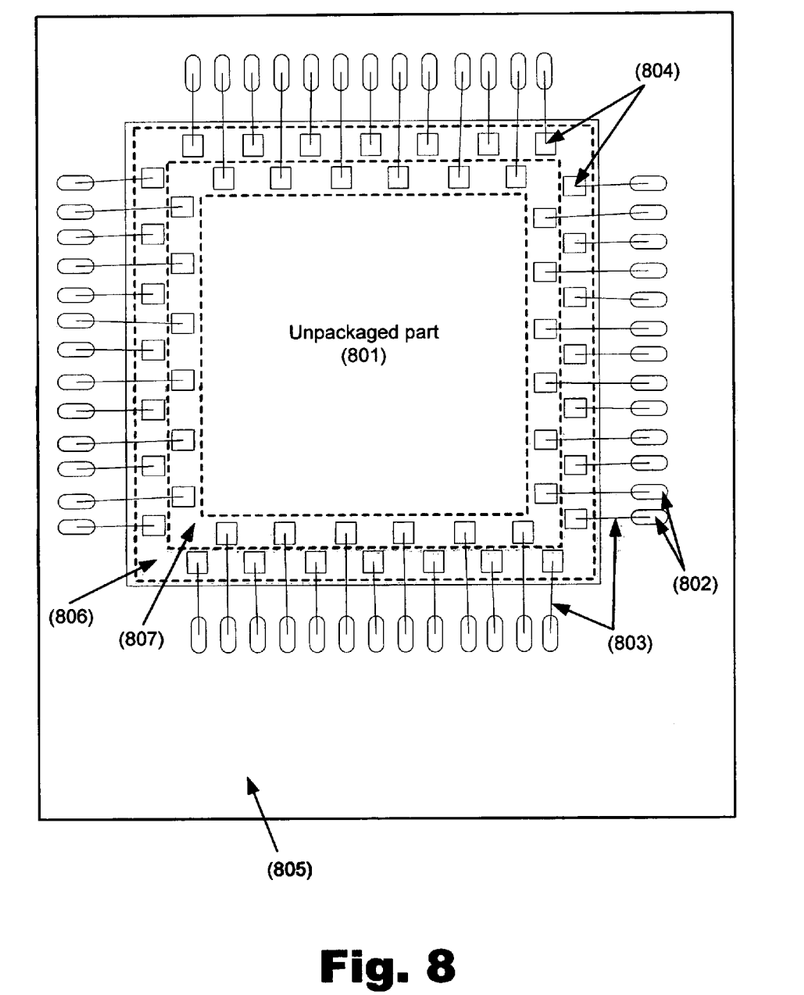
FIG. 8 is an illustration of a top-view of an unpackaged semiconductor chip with pads connected to a PC board base, according to another embodiment of the present invention.

FIG. 8 is an illustration of a top-view of an unpackaged semiconductor chip with perimeter pads connected to a PC board base. As shown in FIG. 8, an unpackaged semiconductor chip (801) may be attached to a PC board (805) in similar fashion as shown in FIG. 3, wherein bonding wires (803) may be attached between pads (804) of the unpackaged chip (801) and pads (802) of the PC board (805).

The illustration of FIG. 8 shows another configuration of pads (804) on an unpackaged part (801), wherein the pads (804) are distributed around the perimeter of the unpackaged part (801). More specifically, an outer layer of pads (806) and an inner layer of pads (807) are shown in FIG. 8. The arrangement of perimeter pads (804) shown in FIG. 8 is in contrast to other pad configurations, e.g., the inline central pads shown for the die of FIG. 3.

In general, the use of selectively settable material may greatly facilitate the process of attaching bonding wires to unpackaged chips for any variety of pad configurations. By using selectively settable materials, as described herein, bonding wires can be positioned, physically separated from other wires, readjusted, protected, etc.

Figure 9:
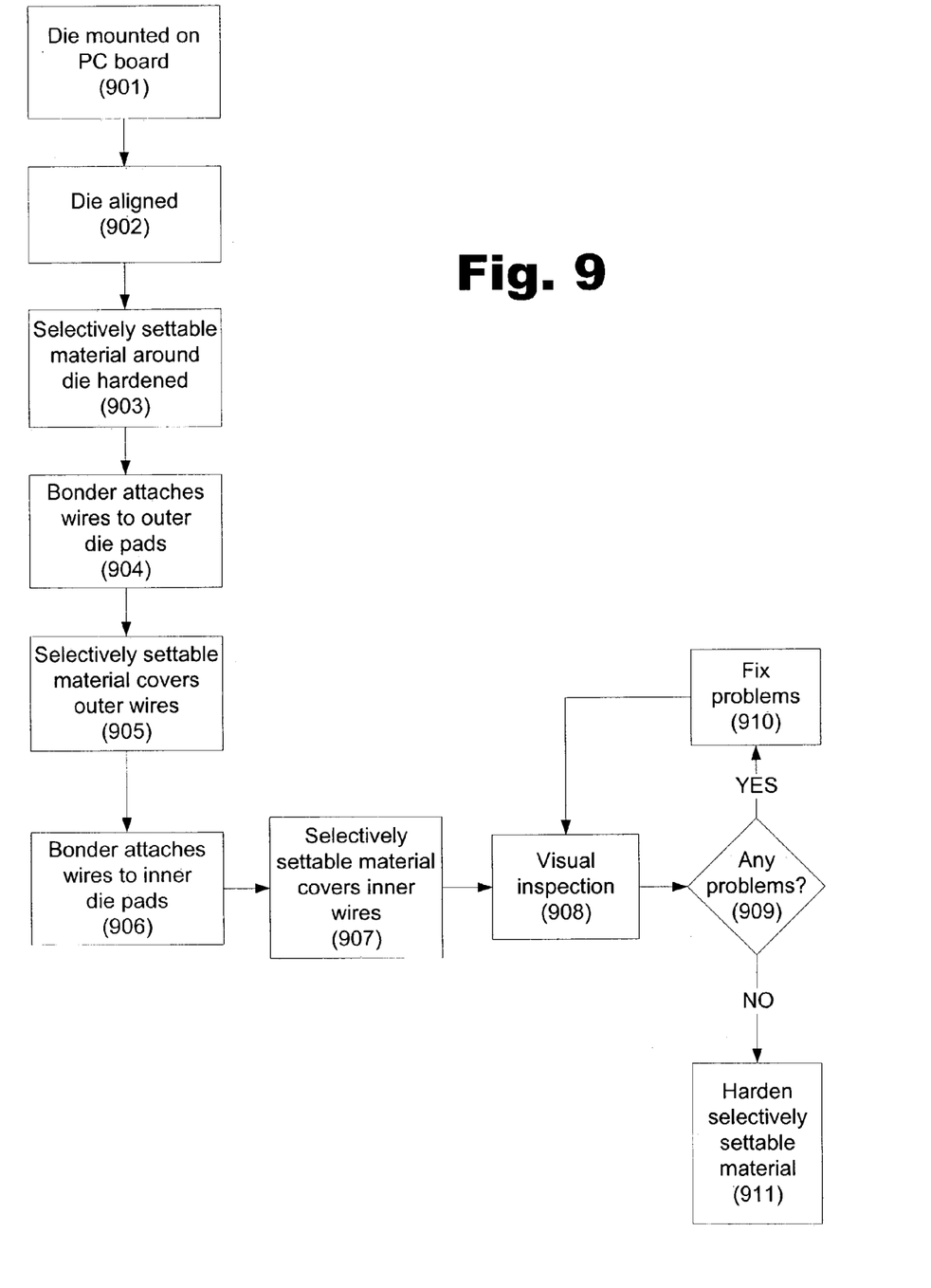
FIG. 9 is a flowchart illustrating a method of mounting unpackaged semiconductor chips according to another embodiment of the present invention.

FIG. 9 is a flowchart illustrating a method of mounting an unpackaged semiconductor chip with perimeter pads. As shown, the method of FIG. 9 is similar to the mounting method (step 100, FIG. 1) shown in FIG. 1. In particular, the method of FIG. 9 illustrates a method of mounting unpackaged semiconductor parts, e.g., the unpackaged part (801, FIG. 8) shown in FIG. 8, which have one or more layers of pads around the perimeter of the unpackaged part.

As shown in FIG. 9, the method comprises mounting a die on a PC board (step 901). This may be accomplished as described for FIG. 1, wherein the alignment of each unpackaged chip is adjusted (step 902), after which a ring of selectively settable material disposed around the chip is cured or hardened (step 903). The hardened ring around each die keeps the die in place.

In some embodiments, a layer of selectively settable material is placed between each die and the PC board. The same settable material that is used between each die and the PC board may also be used around each die or two different selectively settable materials are used as described above.

A bonder may then attach wires between the outer pads of the unpackaged part and pads on a PC board (step 904), as illustrated in FIG. 8. A layer of selectively settable material may be used to cover the bonding wires attached to the outer pads of the unpackaged part (step 905). After which a bonding machine may attach wires between the inner pads of an unpackaged part and pads of a PC board (step 906). By using selectively settable material (as described for FIG. 4b), the possibility of damaging wires, unpackaged parts, etc., is significantly reduced.

After attaching bonding wires between the inner pads of the unpackaged part and pads of a PC board (step 906), another layer of selectively settable material may be added to cover the inner layer of wires and pads (step 907). After the wires are bonded (steps 904, 906), and selectively settable material separates and covers these wires (steps 905, 907), a visual inspection of the wires is made (step 908). If there are any problems (determination 909), e.g., wires that are broken, shorted, out of place, etc., a manual adjustment of the wires and bonds may be used to correct the problem (step 910). The unit may then be visually inspected again (step 908), and if there are no problems (determination 909), the selectively settable material, which covers the wires and pads, is completely hardened (step 911).

The process of FIG. 9 may be carried out using automated machinery for fabrication, etc. In one embodiment, automated machines are programmed to dispense one or more selectively settable liquids, mount unpackaged parts to a PC board, bond wires between unpackaged parts and a PC board, perform functionality tests, etc. In another embodiment, the dispensing of selectively settable liquids, mounting of unpackaged parts to a PC board, and performing functionality tests as described above, may be performed manually. Another embodiment of the Chip-on-Board fabrication process, shown in FIG. 9, uses a combination of automated manual labor.

As is apparent, there exists a variety of Chip-on-Board mounting methods, which may use selectively settable material in a number of ways. In particular, selectively settable material may advantageously be used as a thermal and physical buffer between an unpackaged part and a PC board. Additionally, one or more layers of selectively settable material may effectively be used to capture bonding wires attached to unpackaged semiconductor parts, which use a variety of pad configurations. As illustrated above, pads on an unpackaged semiconductor part may be placed in the center of a die (as shown in FIG. 3), around the perimeter of a die (as shown in FIG. 8), or any other configuration.

The preceding description has been presented only to illustrate and describe embodiments of invention. It is not intended to be exhaustive or to limit the invention to any precise form disclosed. Many modifications and variations are possible in light of the above teaching. It is intended that the scope of the invention be defined by the following claims.

What is claimed is:

1. A method of fabricating Chip-on-Board logic modules using selectively settable materials, said method comprising:
   mounting unpackaged die using a first layer of selectively-settable material;
   hardening a ring of said first layer of selectively-settable material around a periphery said unpackaged die;
   covering said first layer of selectively-settable material with a second layer of selectively-settable material; and
   capturing bonding wires connecting said unpackaged die to a printed circuit board in said second layer of selectively-settable material.

2. The method of claim 1, wherein part of said first layer of selectively-settable material extends above said unpackaged die.

3. The method of claim 1, wherein said capturing bonding wires comprises placing only a part of each of the bonding wires in said second layer of selectively-settable material, ten hardening said second layer of selectively settable material.

4. The method of claim 1, further comprising placing selectively settable material between said unpackaged die and said printed circuit board to provide a physical and thermal buffer.

5. The method of claim 4, wherein said selectively settable material between said unpackaged die and said printed circuit board is less cured than said first and second layers of selectively-settable material.

6. The method of claim 1, wherein said selectively settable materials comprise UV-settable materials.

7. A method of fabricating a Chip-on-Board logic module using selectively settable materials, said method comprising:
mounting one or more electronic logic parts on a printed circuit board using said selectively settable materials;
selectively hardening areas of a selectively settable material;
attaching bonding wires between pads of said logic parts and pads of said printed circuit board;
applying selectively settable material to cover a portion of each of said bonding wires;
then, inspecting bonding wire connections;
readjusting bonding wires, if needed; and
hardening said selectively settable material that covers said bonding wires.

8. The method of claim 7, wherein said one or more selectively settable materials comprises UV-settable materials.

9. The method of claim 7, wherein said mounting one or more logic parts further comprises aligning the memory parts on said punted circuit board.

10. The method of claim 7, wherein said mounting one or logic parts using said selectively settable materials comprises applying a quantity of a selectively settable material between unpackaged logic pans and said printed circuit board.

11. The method of claim 7, wherein said mounting one or logic parts using said selectively settable materials further comprises applying a quantity of a selectively settable material around unpackaged logic parts.

12. The method of claim 10, wherein said selectively settable material between unpackaged logic pans and said printed circuit board is not hardened.

13. The method of claim 7, wherein said selectively hardening areas of said selectively settable material comprises hardening axing of selectively settable material around said unpackaged logic part.

14. The method of claim 7, wherein one selectively settable material is used.

15. The method of claim 7, wherein more than one selectively settable materials are used.

16. The method of claim 7, wherein a selectively settable material used between an unpackaged logic part and a printed circuit board is never hardened, while a selectively settable material used around said unpackaged logic part is hardened.

17. A method of fabricating Chip-on-Board logic modules using selectively settable materials, said method comprising:
mounting unpackaged die on a circuit board using a first layer of selectively-settable material;
hardening a portion of said first layer of selectively-settable material such that said unpackaged die is secured to said circuit board, but some of said selectively-settable material between said unpackaged die and said circuit board is never fully hardened.

18. The method of claim 17, wherein part of said first layer of selectively-settable material extends above said unpackaged die.

19. The method of claim 17, further comprising:
applying a second layer of selectively-settable material over said first layer of selectively-settable material; and
hardening said second layer of selectively-settable material so as to capture bonding wires connecting said unpackaged die to a printed circuit board in said hardened second layer of selectively-settable material.

20. The method of claim 19, wherein said capturing bonding wires comprises placing only a part of each of the bonding wires in said second layer of selectively-settable material, then hardening said second layer of selectively settable material.

21. The method of claim 17, wherein said selectively-settable material between said unpackaged die and said printed circuit board provides a physical and thermal buffer.

22. The method of claim 17, wherein said selectively settable material between said unpackaged die and said printed circuit board is in a liquid form.

23. The method of claim 17, wherein said selectively settable material between said unpackaged die and said printed circuit board is less cured said first layer of selectively-settable material.

24. The method of claim 17, wherein said selectively settable material comprises a UV-curable material.

25. A Chip-on-Board logic module using selectively settable materials, said module comprising:
a circuit board;
an unpackaged die mounted on said circuit board using a first layer of selectively-settable material, wherein a portion of said first layer of selectively-settable material has been hardened such that said unpackaged die is secured to said circuit board, but some of said selectively-settable material between said unpackaged die and said circuit board is never fully hardened.

26. The module of claim 25, wherein part of said first layer of selectively-settable material extends above said unpackaged die.

27. The module of claim 25, further comprising:
a hardened second layer of selectively-settable material applied over said first layer of selectively-settable material; and
a plurality of bonding wires connecting said unpackaged die to said circuit board, wherein said bonding wires are at least partially captured in said hardened second layer of selectively-settable material.

28. The module of claim 25, wherein said selectively-settable material between said unpackaged die and said printed circuit board provides a physical and thermal buffer.

29. The module of claim 25, wherein said selectively settable material between said unpackaged die and said printed circuit board is in a liquid form.

30. The module of claim 25, wherein said selectively settable material between said unpackaged die and said printed circuit board is less cured said first layer of selectively-settable material.

31. The module of claim 25, wherein said selectively settable material comprises a UV-curable material.

32. The module of claim 25, wherein said unpackaged die has one or more faulty input/output lines which are compensated for by input/output lines of another unpackaged die mounted on said circuit board.

33. The method of claim 1, further comprising forming said first layer of selectively-settable material in a ring around said unpackaged die.

34. The method of claim 1, wherein mounting said unpackaged die further comprises positioning said unpackaged die in said first layer of selectively-settable material in a desired position relative to said printed circuit board before said selectively-settable material is hardened and then performing said hardening of said first layer of selectively-settable material.

35. The method of claim 7, wherein said logic parts comprise memory parts.

36. The method of claim 1, wherein said second layer of selectively-settable material is applied in a ring over said first layer of selectively-settable material.

37. The method of claim 1, wherein said second layer of selectively-settable material captures only a portion of each of said bonding wires.

38. The method of claim 1, further comprising placing a cover over said unpackaged die and attaching said cover a circuit board on which said unpackaged die is mounted, said cover not being in direct contact with said unpackaged die.

39. The method of claim 1, further comprising resting said bonding wires on said first layer of selectively-settable material prior to application of said second layer of selectively-settable material.

\* \* \* \* \*

UNITED STATES PATENT AND TRADEMARK OFFICE
CERTIFICATE OF CORRECTION

PATENT NO. : 7,238,550 B2  Page 1 of 1
APPLICATION NO. : 10/371800
DATED : July 3, 2007
INVENTOR(S) : Charles I. Peddle It is certified that error appears in the above-identified patent and that said Letters Patent is hereby corrected as shown below:

Column 11, Line 30, Claim 9, change "parts on said punted..." to --parts on said printed--

Column 11, Line 34, Claim 10, change "between unpackaged logic pans..." to --between unpackaged logic parts--

Column 11, Line 41, Claim 12, change "...between unpackaged logic pans" to --between unpackaged logic parts--

Column 11, Line 45, Claim 13, change "hardening axing of selectively..." to --hardening a ring of selectively--

Signed and Sealed this

Sixteenth Day of October, 2007

JON W. DUDAS
*Director of the United States Patent and Trademark Office*